(12) United States Patent
Qiao et al.

(10) Patent No.: US 10,790,312 B2
(45) Date of Patent: Sep. 29, 2020

(54) DISPLAY PANEL AND DISPLAY DEVICE

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventors: Yun Qiao, Beijing (CN); Zhen Wang, Beijing (CN); Lele Cong, Beijing (CN); Zhengkui Wang, Beijing (CN); Jianjun Zhang, Beijing (CN); Han Zhang, Beijing (CN); Wenwen Qin, Beijing (CN); Fei Huang, Beijing (CN); Xiaozhou Zhan, Beijing (CN); Peng Liu, Beijing (CN); Jian Sun, Beijing (CN)

(73) Assignees: ORDOS YUANSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/352,379

(22) Filed: Mar. 13, 2019

(65) Prior Publication Data
US 2019/0288009 A1 Sep. 19, 2019

(30) Foreign Application Priority Data
Mar. 13, 2018 (CN) .......................... 2018 1 0203900

(51) Int. Cl.
*H01L 27/12* (2006.01)
(52) U.S. Cl.
CPC ........ *H01L 27/124* (2013.01); *H01L 27/1218* (2013.01)

(58) Field of Classification Search
CPC ..................................................... H01L 27/124
See application file for complete search history.

(56) References Cited

U.S. PATENT DOCUMENTS

| | | | | |
|---|---|---|---|---|
| 6,949,883 | B2* | 9/2005 | Matsueda | G02F 1/1341 |
| | | | | 315/169.3 |
| 10,534,230 | B2* | 1/2020 | Choi | G09G 3/20 |

(Continued)

FOREIGN PATENT DOCUMENTS

| | | |
|---|---|---|
| CN | 101110189 A | 1/2008 |
| CN | 103823314 A | 5/2014 |

(Continued)

OTHER PUBLICATIONS

First Office Action for Chinese Application No. 201810203900.4, dated Sep. 23, 2019, 9 Pages.

(Continued)

*Primary Examiner* — Earl N Taylor
(74) *Attorney, Agent, or Firm* — Brooks Kushman P.C.

(57) ABSTRACT

A display panel and a display device are provided. The display panel includes a base substrate, the base substrate includes a display region and a non-display region, the display region includes a main display region and a peripheral display region, and the peripheral display region includes an irregular display region; the non-display region includes a first region and a second region, the first region is adjacent to the irregular display region, and the second region is adjacent to other regions of the peripheral display region than the irregular display region; the display region includes at least one signal line, the non-display region includes at least one functional circuit and at least one wire, and the at least one functional circuit is coupled to the at least one signal line via the at least one wire.

14 Claims, 7 Drawing Sheets

(56) References Cited

U.S. PATENT DOCUMENTS

| | | | |
|---|---|---|---|
| 2010/0102719 A1* | 4/2010 | Lee | H01L 51/5246 |
| | | | 313/512 |
| 2014/0139771 A1* | 5/2014 | Choi | G02F 1/133305 |
| | | | 349/43 |
| 2017/0221927 A1 | 8/2017 | Li | |
| 2017/0249905 A1 | 8/2017 | Kim et al. | |
| 2017/0338295 A1 | 11/2017 | Lee et al. | |
| 2018/0166018 A1* | 6/2018 | Yang | H01L 27/32 |
| 2018/0166467 A1* | 6/2018 | Lai | G02F 1/13452 |
| 2019/0259345 A1* | 8/2019 | Hosoyachi | G02F 1/134309 |
| 2019/0288009 A1* | 9/2019 | Qiao | H01L 27/124 |

FOREIGN PATENT DOCUMENTS

| | | | |
|---|---|---|---|
| CN | 105044960 A | 11/2015 | |
| CN | 107393472 A | 11/2017 | |
| CN | 107561799 A | 1/2018 | |
| CN | 107610636 A | 1/2018 | |
| CN | 107784940 A | 3/2018 | |
| JP | 2008046307 A | 2/2008 | |

OTHER PUBLICATIONS

Second Office Action for Chinese Application No. 201810203900.4, dated May 6, 2020, 10 Pages.

\* cited by examiner

DISPLAY PANEL AND DISPLAY DEVICE

CROSS REFERENCE OF RELATED APPLICATION

This application claims priority to Chinese Patent Application No. 201810203900.4 filed on Mar. 13, 2018, which is incorporated herein by reference in its entirety.

TECHNICAL FIELD

The present disclosure relates to the field of display technology, and in particularly to a display panel and a display device.

BACKGROUND

The full screen mobile phone is the main development trend of the current mobile phone display panel. How to carry out the wiring operation at the irregular corner of the full screen mobile phone and reduce the frame size at the irregular portion is a key point of the full screen design.

SUMMARY

A display panel is provided in the present disclosure, including a base substrate, where the base substrate includes a display region and a non-display region, the display region includes a main display region and a peripheral display region, and the peripheral display region includes an irregular display region;

the non-display region includes a first region and a second region, the first region is adjacent to the irregular display region, and the second region is adjacent to other regions of the peripheral display region than the irregular display region;

the display region includes at least one signal line, the non-display region includes at least one functional circuit and at least one wire, and the at least one functional circuit is coupled to the at least one signal line via the at least one wire.

Optionally, at least one of the at least one wire is at the first region of the non-display region.

Optionally, the at least one functional circuit includes a plurality of first functional circuits and a plurality of second functional circuits, the at least one wire includes a plurality of first wires and a plurality of second wires, and the at least one signal line includes a plurality of first signal lines and a plurality of second signal lines;

the plurality of first functional circuits are coupled to the plurality of first signal lines respectively via the plurality of first wires, and the plurality of second functional circuits are coupled to the plurality of second signal lines respectively via the plurality of second wires;

the second region includes a first sub-region and a second sub-region.

Optionally, the plurality of first functional circuits and the plurality of second functional circuits are arranged respectively at the first sub-region and the second sub-region, and at least one of the plurality of first wires or at least one of the plurality of second wires is arranged at the first region.

Optionally, at least one of the plurality of first wires is arranged at the first region, the at least one first wire at the first region has a first length, the first wire other than the at least one first wire at the first region has a third length, and the first length is greater than the third length.

Optionally, at least one of the plurality of second wires is arranged at the first region, the at least one second wire at the first region has a second length, the second wire other than the at least one second wire at the first region has a fourth length, and the second length is greater than the fourth length.

Optionally, the plurality of first functional circuits include a first sub functional circuit at the first region, the first wire coupled to the first sub functional circuit is at the first region, the plurality of second functional circuits are at the second region, and at least one of the plurality of second wires is at the first region.

Optionally, the plurality of first functional circuits further include a third sub functional circuit at the first sub-region, the first wire coupled to the first sub functional circuit has a first length, the first wire coupled to the third sub functional circuit has a third length, and the first length is greater than the third length.

Optionally, the at least one second wire at the first region has a second length, the second wire other than the at least one second wire at the first region has a fourth length, and the second length is greater than the fourth length.

Optionally, the plurality of first functional circuits include a plurality of first sub functional circuits at the first region, and the first wires coupled to the plurality of first sub functional circuits are at the first region;

the plurality of second functional circuits include a plurality of second sub functional circuits at the first region, and the second wires coupled to the plurality of second sub functional circuits are at the first region;

the plurality of first sub functional circuits and the plurality of second sub functional circuits are alternately arranged.

Optionally, the plurality of first functional circuits further include a third sub functional circuit at the first sub-region, the first wires coupled to the first sub functional circuits each has a first length, the first wire coupled to the third sub functional circuit has a third length, and the first length is greater than the third length.

Optionally, the plurality of second functional circuits further include a fourth sub functional circuit at the second sub-region, the second wires coupled to the second sub functional circuits each has a second length, the second wire coupled to the fourth sub functional circuit has a fourth length, and the second length is greater than the fourth length.

Optionally, the plurality of second functional circuits includes a second sub functional circuit at the first region, the second wire coupled to the second sub functional circuit is at the first region, the plurality of first functional circuits are at the second region, and at least one of the plurality of first wires is at the first region.

Optionally, the plurality of second functional circuits further include a fourth sub functional circuit at the second sub-region, the second wire coupled to the second sub functional circuit has a second length, the second wire coupled to the fourth sub functional circuit has a fourth length, and the second length is greater than the fourth length.

Optionally, the at least one first wire at the first region has a first length, the first wire other than the at least one first wire at the first region has a third length, and the first length is greater than the third length.

Optionally, both the at least one functional circuit and the at least one wire are at the second region.

Optionally, the plurality of first functional circuits are gate driving circuits, and the plurality of first signal lines are gate lines;

the plurality of second functional circuits are data driving circuits, and the plurality of second signal lines are data lines.

A display device is further provided in the present disclosure, including the display panel hereinabove.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

The rectangular display panel in the related art commonly has gate driving circuits at the left and right the frame respectively, and devices such as a switch for electrical testing are arranged at the top side of the frame. However, if the frame layout scheme of the rectangular display panel is directly applied to the irregular display panel, there may be many technical defects, e.g., the number of wires at the irregular corners of the display panel is too large, and the frame portion at the irregular corners of the display panel is too wide.

Figure 1A:
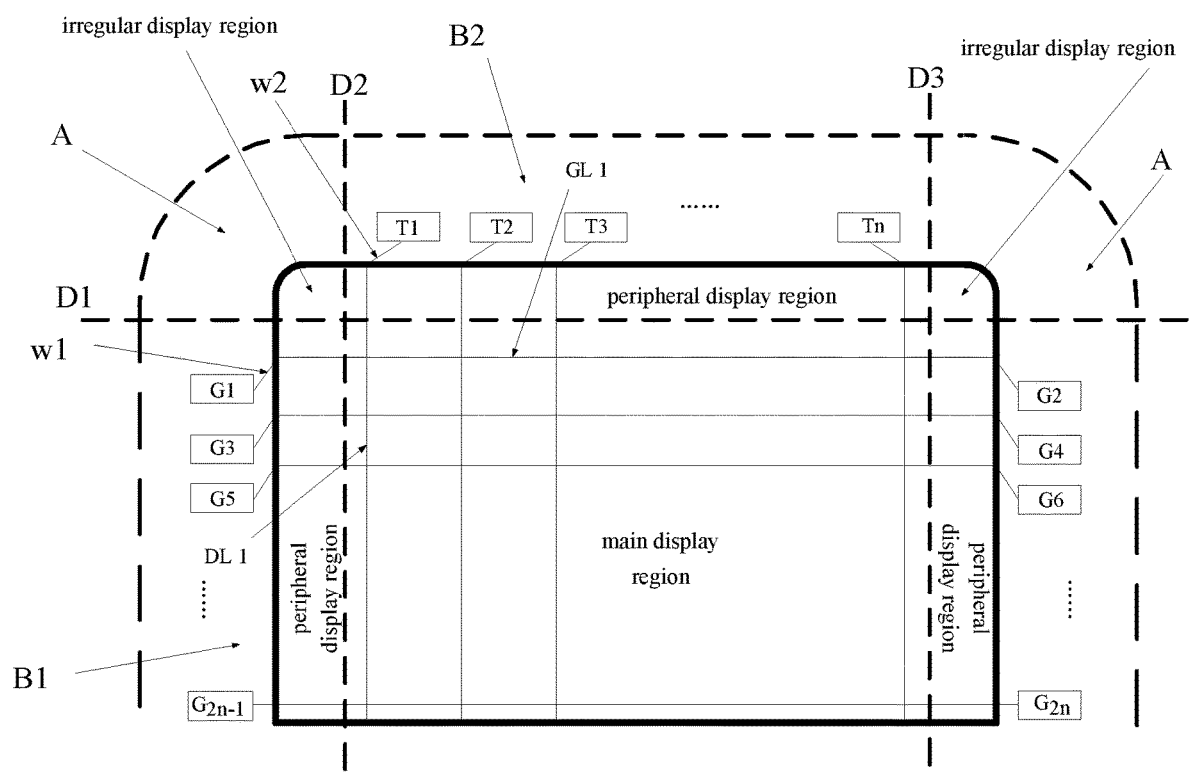
FIG. 1a is schematic view of a display panel in some embodiments of the present disclosure.
Figure 1B:
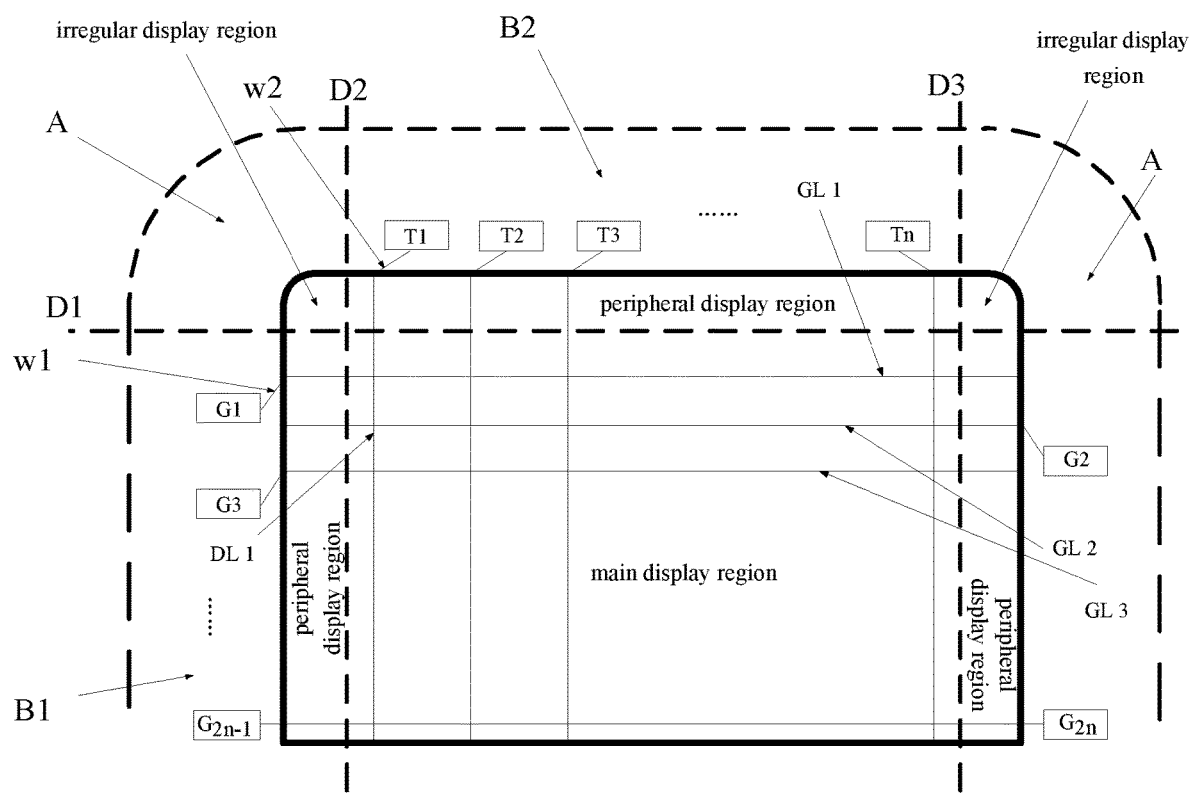
FIG. 1b is schematic view of a display panel in some embodiments of the present disclosure.

A display panel is provided in some embodiments of the present disclosure. As shown in FIG. 1a and FIG. 1b, the display panel includes a base substrate, where the base substrate includes a display region and a non-display region, the display region includes a main display region and a peripheral display region, and the peripheral display region includes an irregular display region. The non-display region includes a first region A and a second region B, the first region A is adjacent to the irregular display region, and the second region B is adjacent to other regions of the peripheral display region than the irregular display region. The display region includes at least one signal line, the non-display region includes at least one functional circuit and at least one wire, and the at least one functional circuit is coupled to the at least one signal line via the at least one wire. The at least one functional circuit is display driving circuit (for example, gate driving circuit or data driving circuit), electrostatic discharge circuit or other circuit on the display panel.

The division of the above "regions" will be illustrated below. Taking FIG. 1a showing the upper half portion of the display panel as an example, dotted lines D1, D2 and D3 divide the display region into a main display region and peripheral display regions. For the regions above the dotted line D1, the region on the left of the dotted line D2 (and on the right of the D3) is the irregular display region, and the region between the dotted lines D2 and D3 is the peripheral display region. For the regions below the dotted line D1, the region on the left of the dotted line D2 (and on the right of the D3) is another peripheral display region, and the region between the dotted lines D2 and D3 is the main display region. The division of "regions" in other drawings of the present disclosure is the same with FIG. 1a, and the detailed description thereof is omitted herein.

In some embodiments of the present disclosure, as shown in FIG. 1a and FIG. 1b, the at least one functional circuit includes a plurality of first functional circuits (e.g., gate driving circuits $G_1$, $G_3$, ... $G_{2n-1}$) and a plurality of second functional circuits (e.g., date line driving circuits $T_1$, $T_2$, $T_3$, ... $T_n$), the at least one wire includes a plurality of first wires w1 and a plurality of second wires w2, and the at least one signal line includes a plurality of first signal lines (e.g., gate lines GL) and a plurality of second signal lines (e.g., date lines DL).

The plurality of first functional circuits are coupled to the plurality of first signal lines respectively via the plurality of first wires w1, and the plurality of second functional circuits are coupled to the plurality of second signal lines respectively via the plurality of second wires w2.

The second region includes a first sub-region B1 and a second sub-region B2.

In some embodiments of the present disclosure, the base substrate may be a rectangular substrate including two irregular display regions or four irregular display regions. The irregular display region may be a rounded corner, a corner cut or be of other irregular shapes. It should be noted that, the above display substrate may be of other shapes, such as polygon, oval or the like, and there may be one irregular display region or a plurality of irregular display regions.

It should be noted that the above first functional circuits may gate driving circuits, and the above first signal lines may be gate lines; the above second functional circuits may be data driving circuits, and the above second signal lines may be data lines.

For example, as shown in FIG. 1a, the gate lines on the base substrate may be of a dual-sides driving structure. $2n$ gate driving circuits are arranged at both the left and right frame portions. The gate driving circuits $G_1$, $G_3$, $G_{2n-1}$ are arranged at the left frame portion, and gate driving circuits $G_2$, $G_4$, $G_{2n}$ are arranged at the right frame portion. The switch for electrical testing is arranged at the top frame portion. For example, n date line driving circuits are arranged at the top frame portion, the data driving circuits $T_1$, $T_2$, $T_3$, ... $T_n$ are arranged in sequence from the left side to the right side.

For another example, as shown in FIG. 1b, the gate lines may also be of a single-side interlaced driving structure. To be specific, the gate driving circuits may be arranged respectively at the left and right sides of the base substrate. The left end of the gate line GL1 in the first row is connected to the gate driving circuit G1, the right end of the gate line GL2 in the second row is connected to the gate driving circuit G2, and the left end of the gate line GL3 in the third row is connected to the gate driving circuit G3.

It should be noted that, in some embodiments of the present disclosure, the data lines on the base substrate (e.g., the data line DL1 connected to the data driving circuit T1 shown in FIG. 1a and FIG. 1b) may also be of a dual-sides driving structure. That is, the data driving circuits are arranged respectively at the top portion and the bottom portion of the base substrate, each data line is connected to two data driving circuits. In some embodiments of the present disclosure, the gate lines may also be of a single-side interlaced driving structure. That is, the top end of the date line in the odd-numbered column is connected to the data driving circuit, i.e., the date line in the odd-numbered column is driven by the data driving circuit at the top side; the bottom end of the date line in the even-numbered column is connected to the data driving circuit, i.e., the date line in the even-numbered column is driven by the data driving circuit at the bottom side. The arrangement of the data lines hereinabove is similar to that of the gate lines, and the detailed description thereof is omitted herein.

It should be noted that, in some embodiments of the present disclosure, the gate lines may also be of a single-side driving structure, i.e., the gate driving circuits may only be arranged at the left side or the right side of the base substrate.

In some embodiments of the present disclosure, as shown in FIG. 1a and FIG. 1b, the gate driving circuits G and the first wires w1 connected thereto are both at the first sub-region B1, the data driving circuits T and the second wires w2 connected thereto are both at the second sub-region B2. The first region A does not have any functional circuit or wire.

According to above embodiments of the present disclosure, the first region corresponding to the irregular display region does not need to be provided with any driving circuit or other components, so the area of the first region is small, the connection of the gate lines and the connection of the data lines may be achieved by only a few wires at the first region. Therefore, the frame portion corresponding to the first region may be minimized, thereby realizing a display panel with the smallest frame size. In addition, the above driving circuits arranged uniformly may be manufactured easily.

In some embodiments of the present disclosure, the first functional circuits and the second functional circuits are arranged respectively at the first sub-region B1 and the second sub-region B2, and at least one of the first wires w1 or at least one of the second wires w2 is arranged at the first region A.

Figure 2A:
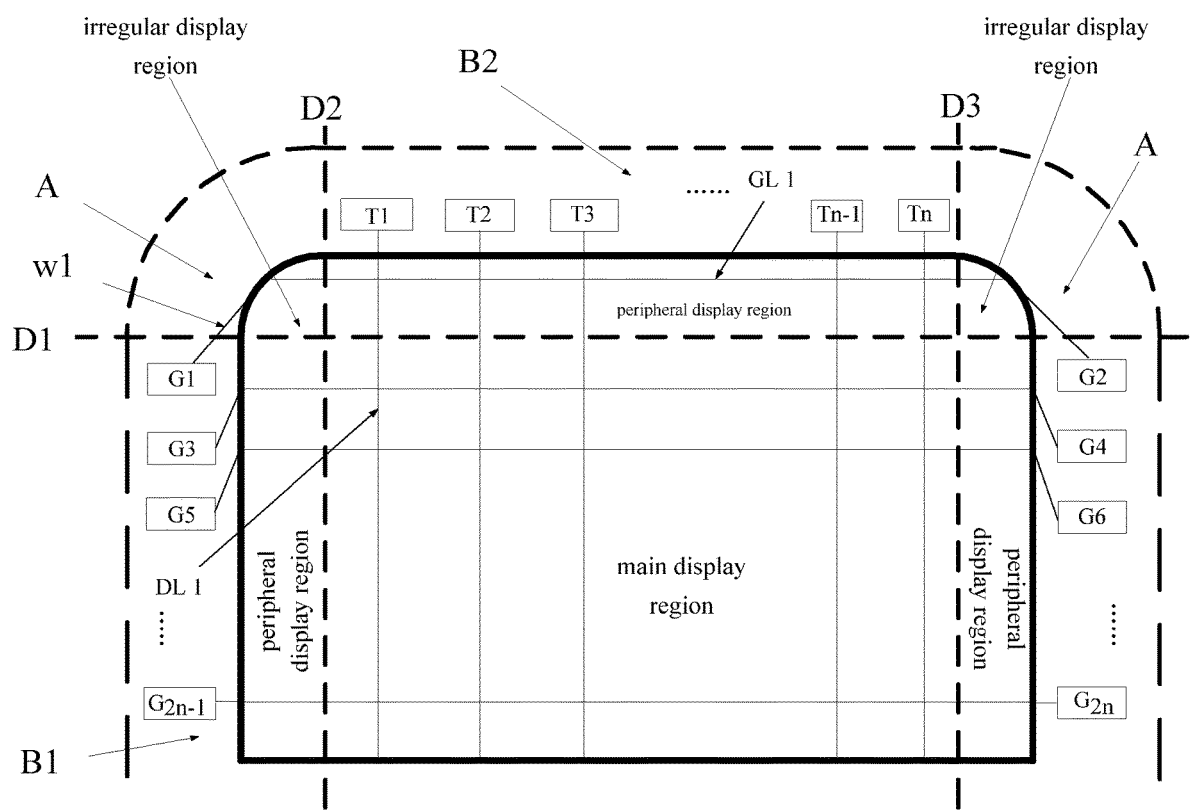
FIG. 2a is schematic view of a display panel in some embodiments of the present disclosure.

For example, as shown in FIG. 2a, the gate driving circuits $G_1, G_3, \ldots G_{2n-1}$ are arranged at the first sub-region B1, the date line driving circuits $T_1, T_2, T_3, \ldots T_n$ are arranged at the second sub-region B2, and at least one of the first wires w1 is arranged at the first region A.

The at least one first wire w1 at the first region A has a first length, the first wire other than the at least one first wire w1 at the first region has a third length, and the first length is greater than the third length.

Figure 2B:
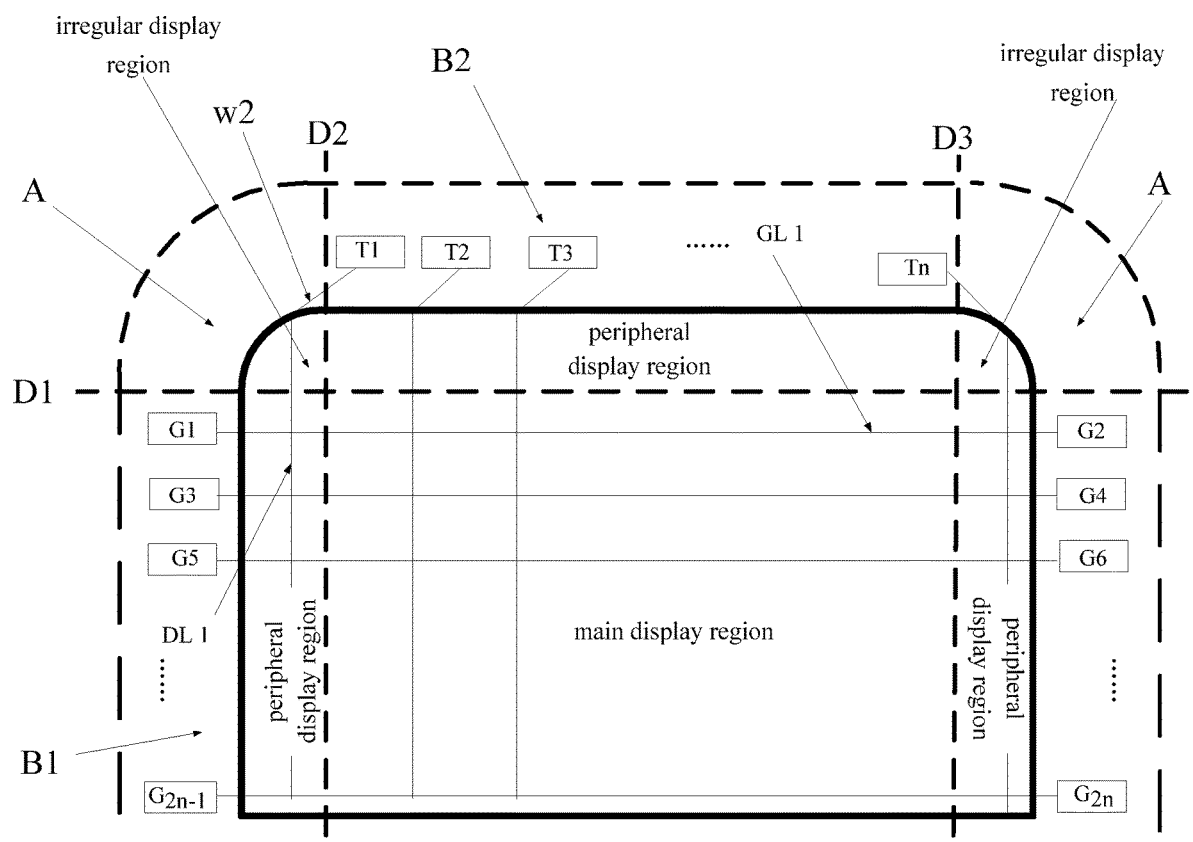
FIG. 2b is schematic view of a display panel in some embodiments of the present disclosure.

For another example, as shown in FIG. 2b, the gate driving circuits $G_1, G_3, \ldots G_{2n-1}$ are arranged at the first sub-region B1, the date line driving circuits $T_1, T_2, T_3, \ldots T_n$ are arranged at the second sub-region B2, and at least one of the second wires w2 is arranged at the first region A.

The at least one second wire w2 at the first region has a second length, the second wire other than the at least one second wire w2 at the first region has a fourth length, and the second length is greater than the fourth length.

According to above embodiments of the present disclosure, the first region corresponding to the irregular display region does not need to be provided with any driving circuit or other components, so the area of the first region is small, the connection of the gate lines and the connection of the data lines may be achieved by only a few wires at the first region. Therefore, the frame portion corresponding to the first region may be minimized, thereby realizing a display panel with the smallest frame size. In addition, the above driving circuits arranged uniformly may be manufactured easily.

Figure 3:
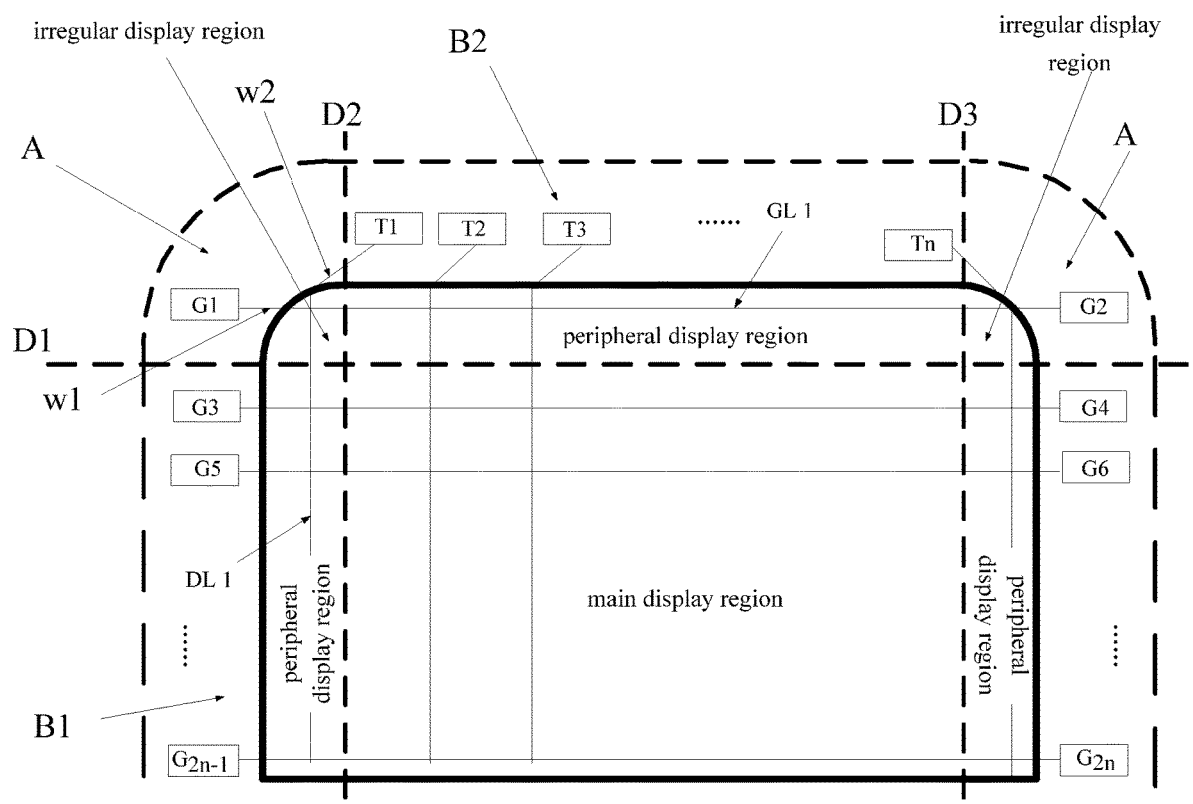
FIG. 3 is schematic view of a display panel in some embodiments of the present disclosure.

In some embodiments of the present disclosure, as shown in FIG. 3, the plurality of first functional circuits include a first sub functional circuit (i.e., the gate driving circuit $G_1$) at the first region A, the first wire w1 coupled to the first sub functional circuit is at the first region A, the plurality of second functional circuits (i.e., date line driving circuits $T_1, T_2, T_3, \ldots T_n$) are at the second region, and at least one second wire w2 is at the first region A.

In some embodiments of the present disclosure, the plurality of first functional circuits further include a third sub functional circuit (i.e., gate driving circuits $G_3, \ldots G_{2n-1}$) at the first sub-region B1. As shown in FIG. 3, at the first sub-region A, the first wire w1 coupled to the gate driving circuit $G_1$ has a first length, the first wires coupled to the gate driving circuits $G_3, \ldots G_{2n-1}$ each has a third length, and the first length is greater than the third length.

In some embodiments of the present disclosure, the second wire w2 at the first region A has a second length, the second wires other than the at least one second wire w2 at the first region A (i.e., the second wires at the second sub-region B2) each has a fourth length, and the second length is greater than the fourth length.

According to the above embodiments of the present disclosure, the area of the irregular display region is larger than that of the irregular display region in FIG. 1a and FIG. 1b. If the wire arrangement scheme of FIG. 1a and FIG. 1b is applied, the first region corresponding to the irregular display region does not have any driving circuit, and then the first region needs a relative large number of wires, the frame size may not be optimized. Therefore, according to the above embodiments, the irregular display region may be provided with the gate driving circuit, and then the wire wrapping of the gate driving circuit may be reduced; meanwhile, the irregular display region is not provided with the data driving circuit, so as to reserve the wire wrapping of the data driving circuit. According to the above embodiments, the area of the irregular display region of the display panel may be minimized, thereby realizing a smallest frame size in case of the current area of the irregular display region.

Figure 4:
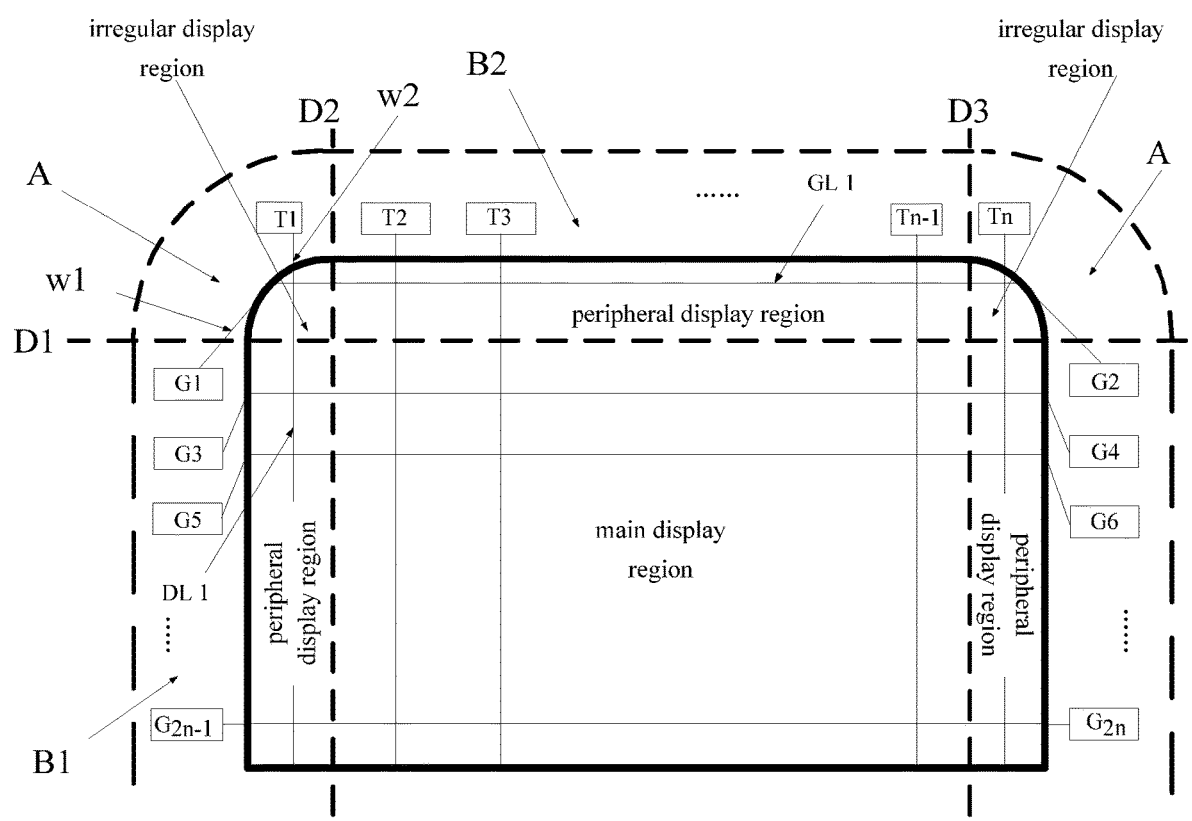
FIG. 4 is schematic view of a display panel in some embodiments of the present disclosure.

In some embodiments of the present disclosure, as shown in FIG. 4, the second functional circuits include a second sub functional circuit (i.e., the data driving circuit $T_1$) at the first region A, the second wire w2 coupled to the second sub functional circuit is at the first region A, the first functional circuits (i.e., gate driving circuits $G_1, G_3, \ldots G_{2n-1}$) are at the second region, and at least one first wire w1 is at the first region A.

In some embodiments of the present disclosure, the second functional circuits further include a fourth sub functional circuit (i.e., date line driving circuits $T_2, T_3, \ldots T_n$) at the second sub-region B2. As shown in FIG. 4, at the first region A, the second wire w2 coupled to the date line driving circuits $T_1$ has a second length. At the second sub-region B2, the second wires coupled to the date line driving circuits $T_2, T_3, \ldots T_n$ each has a fourth length, and the second length is greater than the fourth length.

In some embodiments of the present disclosure, the first wire w1 at the first region A has a first length, the first wires other than the first wire w1 at the first region A (i.e., the first wires at the first sub-region B1) each has a third length, and the first length is greater than the third length.

According to the above embodiments of the present disclosure, the area of the irregular display region is larger than that of the irregular display region in FIG. 1a and FIG. 1b. If the wire arrangement scheme of FIG. 1a and FIG. 1b is applied, the first region corresponding to the irregular display region does not have any driving circuit, and then the first region needs a relative large number of wires, the frame size may not be optimized. Therefore, according to the above embodiments, the irregular display region may be provided with the data driving circuit, and then the wire wrapping of the data driving circuit may be reduced; meanwhile, the irregular display region is not provided with the gate driving circuit, so as to reserve the wire wrapping of the gate driving circuit. According to the above embodiments, the area of the irregular display region of the display panel may be minimized, thereby realizing a smallest frame size in case of the current area of the irregular display region.

Figure 5:
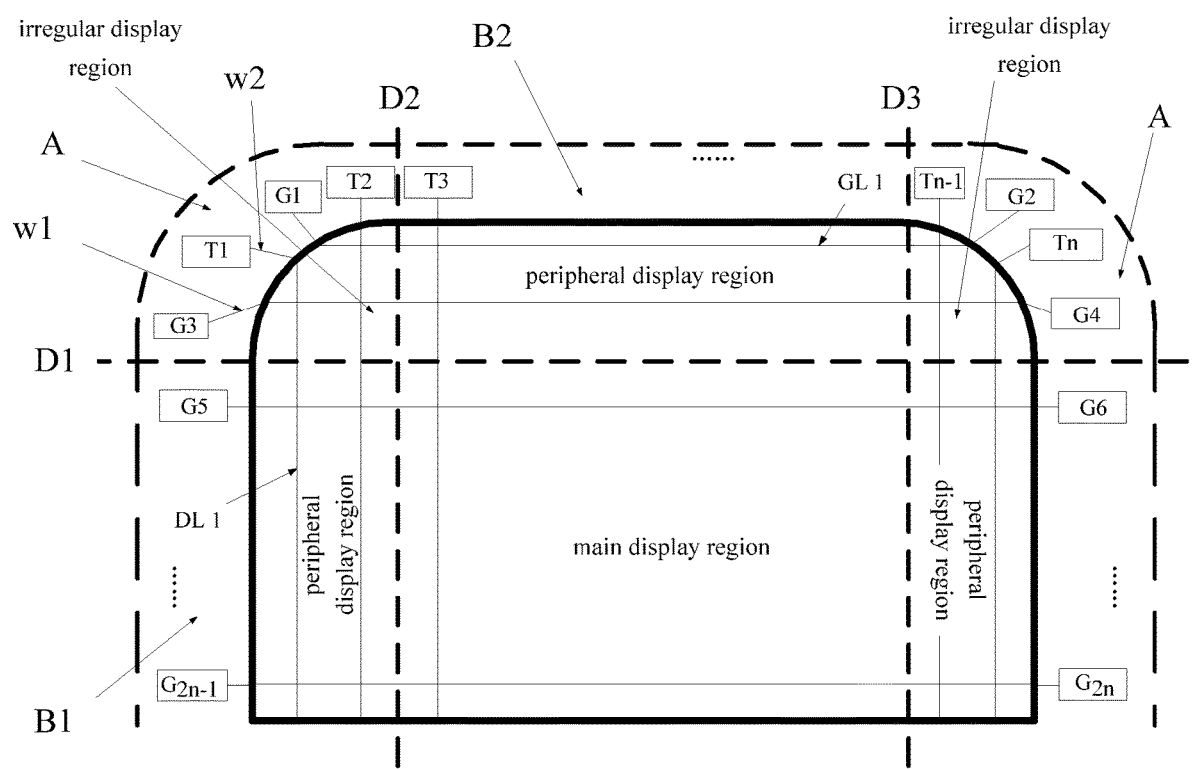
FIG. 5 is schematic view of a display panel in some embodiments of the present disclosure.

In some embodiments of the present disclosure, as shown in FIG. 5, the plurality of first functional circuits include a plurality of first sub functional circuits (i.e., gate driving circuits $G_1$, $G_3$) at the first region A, and the first wires w1 coupled to the first sub functional circuits at the first region A are at the first region A. The plurality of second functional circuits include a plurality of second sub functional circuits (i.e., data driving circuits $T_1$, $T_2$) at the first region A, and the second wires w2 coupled to the second sub functional circuits at the first region A are at the first region A. The gate driving circuits $G_1$, $G_3$ and data driving circuits $T_1$, $T_2$ are alternately arranged.

In some embodiments of the present disclosure, the first functional circuits further include third sub functional circuits (i.e., gate driving circuits $G_3$, ... $G_{2n-1}$) at the first sub-region B1. The first wires w1 coupled to the gate driving circuits $G_1$, $G_3$ each has a first length, the first wires coupled to the gate driving circuits $G_3$, ... $G_{2n-1}$ each has a third length, and the first length is greater than the third length.

In some embodiments of the present disclosure, the plurality of second functional circuits further include fourth sub functional circuits (i.e., date line driving circuits $T_3$, ... $T_n$) at the second sub-region B2. The second wires coupled to the date line driving circuits $T_1$, $T_2$ each has a second length, the second wires coupled to the date line driving circuits $T_3$, ... $T_n$ each has a fourth length, and the second length is greater than the fourth length.

Because the first region are provided with the gate driving circuits and the data driving circuits, the gate driving circuits may be connected to the corresponding gate lines, and the data driving circuits may be connected to the corresponding data lines. In order to optimize the arrangement of the first region corresponding to the irregular display region, the gate driving circuits and the data driving circuits at the first region are alternately arranged.

When the first region has a large area, the above wire arrangement scheme may minimize the frame size of the first region of the display panel, thereby realizing a smallest frame size in case of the current area of the first region.

A display device including the above display panel is further provided in some embodiments of the present disclosure.

In the description of the present disclosure, the terms "set", "connected", "connected", "fixed", etc., should be understood broadly. For example, "connecting" may be a fixed connection, a detachable connection, or an integral connection. The connection may be a direct connection or an indirect connection through intermediate media. For those skilled in the art, the specific meanings of the above terms in the present disclosure should be understood on a case-by-case basis.

The above are merely some embodiments of the present disclosure. A person skilled in the art may make further modifications and improvements without departing from the principle of the present disclosure, and these modifications and improvements shall also fall within the scope of the present disclosure.

What is claimed is:

1. A display panel, comprising a base substrate, wherein the base substrate comprises a display region and a non-display region, the display region comprises a main display region and a peripheral display region, and the peripheral display region comprises an irregular display region;
the non-display region comprises a first region and a second region, the first region is adjacent to the irregular display region, and the second region is adjacent to other regions of the peripheral display region than the irregular display region;
the display region comprises at least one signal line, the non-display region comprises at least one functional circuit and at least one wire, and the at least one functional circuit is coupled to the at least one signal line via the at least one wire;
wherein at least one of the at least one wire is at the first region of the non-display region;
the at least one functional circuit comprises a plurality of first functional circuits and a plurality of second functional circuits, the at least one wire comprises a plurality of first wires and a plurality of second wires, and the at least one signal line comprises a plurality of first signal lines and a plurality of second signal lines;
the plurality of first functional circuits are coupled to the plurality of first signal lines respectively via the plurality of first wires, and the plurality of second functional circuits are coupled to the plurality of second signal lines respectively via the plurality of second wires;
the second region comprises a first sub-region and a second sub-region;
the plurality of first functional circuits comprise a plurality of first sub functional circuits at the first region, and first wires coupled to the plurality of first sub functional circuits are at the first region;
the plurality of second functional circuits comprise a plurality of second sub functional circuits at the first region, and second wires coupled to the plurality of second sub functional circuits are at the first region;
the plurality of first sub functional circuits and the plurality of second sub functional circuits are alternately arranged.

2. The display panel according to claim 1, wherein the plurality of first functional circuits and the plurality of second functional circuits are arranged respectively at the first sub-region and the second sub-region, and at least one of the plurality of first wires or at least one of the plurality of second wires is arranged at the first region.

3. The display panel according to claim 2, wherein at least one of the plurality of first wires is arranged at the first region,
at least one first wire at the first region has a first length, a first wire other than the at least one first wire at the first region has a third length, and the first length is greater than the third length.

4. The display panel according to claim 3, wherein at least one of the plurality of second wires is arranged at the first region,
at least one second wire at the first region has a second length, a second wire other than the at least one second wire at the first region has a fourth length, and the second length is greater than the fourth length.

5. The display panel according to claim 1, wherein the plurality of first functional circuits comprise a first sub functional circuit at the first region, a first wire coupled to the first sub functional circuit is at the first region, the plurality of second functional circuits are at the second region, and at least one of the plurality of second wires is at the first region.

6. The display panel according to claim 5, wherein the plurality of first functional circuits further comprise a third sub functional circuit at the first sub-region,
a first wire coupled to the first sub functional circuit has a first length, a first wire coupled to the third sub functional circuit has a third length, and the first length is greater than the third length.

7. The display panel according to claim 6, wherein at least one second wire at the first region has a second length, a second wire other than the at least one second wire at the first region has a fourth length, and the second length is greater than the fourth length.

8. The display panel according to claim 1, wherein the plurality of first functional circuits further comprise a third sub functional circuit at the first sub-region,
first wires coupled to the first sub functional circuits each has a first length, a first wire coupled to the third sub functional circuit has a third length, and the first length is greater than the third length.

9. The display panel according to claim 8, wherein the plurality of second functional circuits further comprise a fourth sub functional circuit at the second sub-region,
second wires coupled to the second sub functional circuits each has a second length, a second wire coupled to the fourth sub functional circuit has a fourth length, and the second length is greater than the fourth length.

10. The display panel according to claim 1, wherein the plurality of second functional circuits comprise a second sub functional circuit at the first region, a second wire coupled to the second sub functional circuit is at the first region, the plurality of first functional circuits are at the second region, and at least one of the plurality of first wires is at the first region.

11. The display panel according to claim 10, wherein the plurality of second functional circuits further comprise a fourth sub functional circuit at the second sub-region,
a second wire coupled to the second sub functional circuit has a second length, a second wire coupled to the fourth sub functional circuit has a fourth length, and the second length is greater than the fourth length.

12. The display panel according to claim 11, wherein at least one first wire at the first region has a first length, a first wire other than the at least one first wire at the first region has a third length, and the first length is greater than the third length.

13. The display panel according to claim 1, wherein
the plurality of first functional circuits are gate driving circuits, and the plurality of first signal lines are gate lines;
the plurality of second functional circuits are data driving circuits, and the plurality of second signal lines are data lines.

14. A display device comprising the display panel according to claim 1.

* * * * *